United States Patent [19]

Sumi

[11] Patent Number: 5,399,526
[45] Date of Patent: Mar. 21, 1995

[54] METHOD OF MANUFACTURING SEMICONDUCTOR DEVICE BY FORMING BARRIER METAL LAYER BETWEEN SUBSTRATE AND WIRING LAYER

[75] Inventor: Hirofumi Sumi, Kanagawa, Japan
[73] Assignee: Sony Corporation, Tokyo, Japan
[21] Appl. No.: 903,725
[22] Filed: Jun. 24, 1992

[30] Foreign Application Priority Data

Jun. 28, 1991 [JP] Japan .................................. 3-183424
May 20, 1992 [JP] Japan .................................. 4-152828

[51] Int. Cl.6 ............................................. H01L 21/48
[52] U.S. Cl. ................................. 437/190; 437/200; 437/31; 148/DIG. 105
[58] Field of Search ............... 487/190, 192, 194, 200, 487/195; 148/DIG. 105

[56] References Cited

U.S. PATENT DOCUMENTS

| | | | |
|---|---|---|---|
| 4,558,507 | 12/1985 | Okabayashi et al. | 148/DIG. 147 |
| 4,701,349 | 10/1987 | Koyanagi et al. | 437/228 |
| 4,745,089 | 5/1988 | Orban | 437/190 |
| 4,866,009 | 9/1989 | Matsuda | 437/195 |
| 5,063,168 | 11/1991 | Vora | 437/228 |
| 5,162,259 | 11/1992 | Kolar et al. | 437/200 |
| 5,194,405 | 3/1993 | Sumi et al. | 437/200 |

FOREIGN PATENT DOCUMENTS

| | | | |
|---|---|---|---|
| 78522 | 4/1988 | Japan | 148/DIG. 105 |
| 162722 | 6/1990 | Japan | 437/200 |
| 2260630 | 10/1990 | Japan | |
| 3-38823 | 2/1991 | Japan | |

OTHER PUBLICATIONS

Travis et al, "A Scalable Submicron Contact Technology Using Conformal LPCVC TiN", *IEDM* 90 (IEEE) (Apr. 1990) pp. 47-50.

Yoshida et al, "Thermally Stable, Low-Leakage Self-Aligned Titanium Silicide Junctions", *J. Electrochem. Soc.*, vol. 137, No. 6, Jun. 1990, pp. 1914-1917.

*Semiconductor World*, May 1984, pp. 49-53, H. Okabayashi, et al. "Lateral Diffusion Through Silicide".

Sumi et al, "New Silicidation Technology by SITOX (Silicidation Through Oxide) and Its Impact on Sub-half Micron MOS Devices", *IEDM* 90 (IEEE (Apr. 1990), pp. 249-252.

*Primary Examiner*—Olik Chaudhuri
*Assistant Examiner*—C. Everhart
*Attorney, Agent, or Firm*—Hill, Steadman & Simpson

[57] ABSTRACT

A method of manufacturing a semiconductor device which comprises steps of forming a diffusion region to a semiconductor substrate; forming silicon compound film on the diffusion region; forming a metal film on the silicon compound film to form a metal silicide film and, further forming an interlayer film; forming a barrier metal material film on the interlayer film; then patterning the barrier metal material film to obtain a barrier metal layer, subsequently; patterning the interlayer film to form a contact hole and burying a wiring material into the contact hole thereby forming a wiring.

4 Claims, 13 Drawing Sheets

METHOD OF MANUFACTURING SEMICONDUCTOR DEVICE BY FORMING BARRIER METAL LAYER BETWEEN SUBSTRATE AND WIRING LAYER

BACKGROUND OF THE INVENTION

1. Field of the Invention

The present invention concerns a method of manufacturing a semiconductor device and, more in particular, it relates to a method of manufacturing a semiconductor device of a structure in which a barrier metal layer is present between a semiconductor substrate such as a silicon substrate and a wiring layer formed thereon, as well as it relates to a method of manufacturing a semiconductor device using a silicide technique.

2. Description of the Prior Art

For improving the reliability of various kinds of elements in semiconductor devices, it has been conducted to form a barrier layer between a wiring layer and a semiconductor substrate, or preventing reaction between the wiring layer and an underlying semiconductor substrate (for example, Si substrate), for improvement of the close bondability of the wiring film, prevention of disconnection failure and prevention of stress migration. The barrier layer usually comprises metal (or alloy) or a metal compound, which is referred as a barrier metal layer. In the present invention, the term "barrier metal layer" is used for collectively indicating those having a barrier effect. As the material for forming the barrier metal layer, metals or metal compounds such as TiN, TiW, Ti or TiON, tungsten nitride, etc. are used (for the relevant technique in the prior art, refer to descriptions contained in IEDM 90 (1990 IEEE) pp 47–50, by E. O. Travis et. al, "A Scalable Submicron Contact Technology Using Conformal LPCVD TiN").

Figure 3:
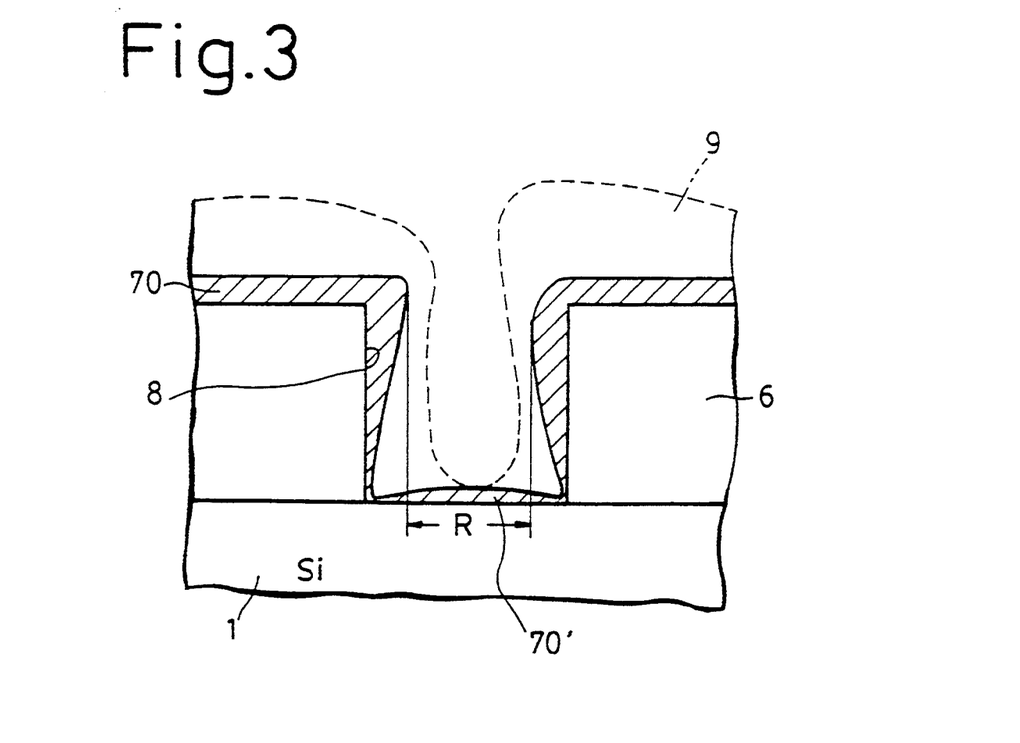
FIG. 3 is a cross-sectional view showing problems in the prior art.

With the recent demand for the integration of semiconductor devices, the size of various kinds of devices has been made finer and along therewith, the size of contact holes, has also been made finer, for example, in ULSI. Therefore, if the barrier metal used for such a structure is formed by deposition in a contact hole 8 by an existent sputtering method as in the known literature described above as shown in FIG. 3, no sufficient coverage can be obtained. That is, since the coverage is deteriorated by the refinement of the contact hole 8, a film of a not-uniform barrier metal 70 is formed in the contact hole 8 disposed to the interlayer film 6 as shown in FIG. 3 to close the opening at the opening portion of the contact hole 8 thereby reducing the hole diameter R for burying a wiring material such as Al and reducing the thickness of the barrier metal layer 70 at the bottom of the contact hole 8. Accordingly, a cavity referred to as a void is liable to be formed as indicated by a broken line also in a wiring material (for example, Al) formed to the upper layer as shown in FIG. 3, which deteriorates the reliability in the connection and brings about a problem of punch through of the wiring material into the underlying Si. Therefore, junction leakage is increased to possibly reduce the reliability, for example, of a transistor as a semiconductor device.

Figure 4A:
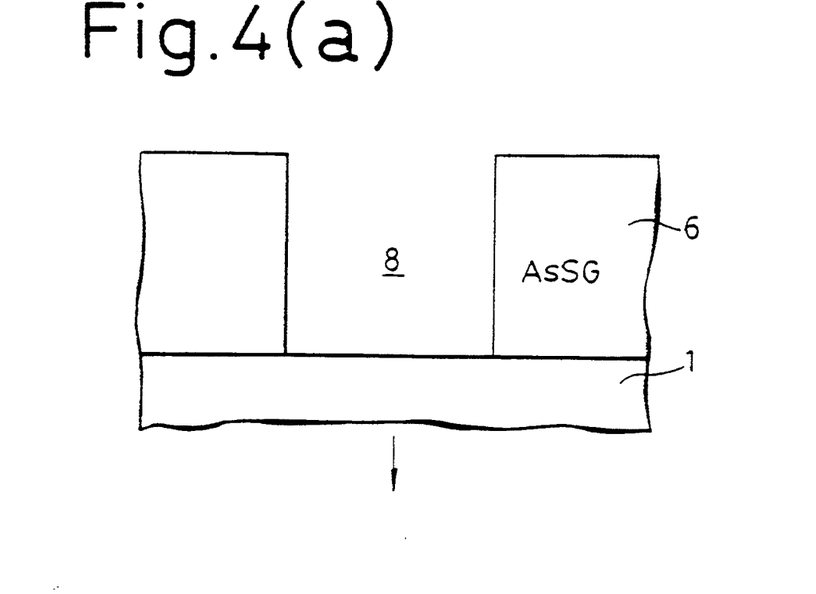
FIG. 4(a) and FIG. 4(b) are cross-sectional views showing problems in the prior art.
Figure 4B:
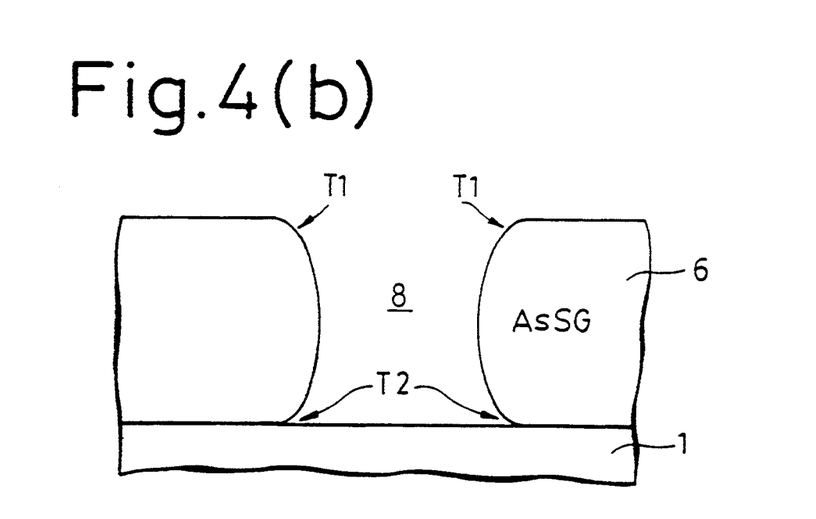

As a countermeasure for the problem described above, a method of forming a taper to a contact hole for improving the coverage has been suggested. For instance, AsSG having a relatively low melting point is used as the material for the interlayer film 6, in which a contact hole 8 is formed and annealing is applied at about 900° C. to conduct fellow for the hole 8 thereby forming a taper T1 as shown in FIG. 4(A). However, when this method adopted, there is a problem that the contact hole 8 is tapered reversely as shown in FIG. 4(B) (reversed taper is shown by T2). Therefore, no sufficient coverage can be obtained and, after all, this method neither provides drastic dissolution.

On the other hand, along with the progress in reducing the process rule of the device described above, it considered important to form an impurity diffusion region of a shallow junction with low resistivity in a semiconductor device for preventing an undesired effect such as short channel effect caused by the reduction of the size.

For reducing the resistivity, a salicide technique of selectively forming a silicide to the surface of a source-drain region (Self Aligned Silicide) has been known and an example of the salicide forming technique, is a known technique of applying Ar+sputter etching to the surface of a substrate, then depositing a metal film and forming a silicide layer in self alignment by means of a two step RTA (Rapid Heat Treatment) (refer, for example, to "J. Electrochem. Soc." Vol. 137, No. 6, June, 1990, pp 1914–1917, published from The Electrochemical Society, Inc.

Further, a general method of forming a junction is ion implantation. In a usual process, an impurity is implanted into a silicon substrate for forming a source-drain region but crystal defects are liable to occur due to damages upon ion implantation. Junction leak due to crystal defects is not increased if the junction is deep but junction leak due to crystal defects is increased if the junction is shallow.

In view of the above, there has been a method of not conducting ion implantation directly to a substrate but previously forming a polysilicon layer or a silicide layer on a source-drain region, implanting an impurity into the polysilicon layer or the silicide layer by ion implantation and, subsequently, forming the impurity region by diffusion annealing and it is described, for example, in "Monthly Semiconductor World", May 1984, pp 49–53 (published by Press Journal Go.). The solid phase diffusion from the polysilicon layer or the silicide layer to the silicon substrate can suppress the occurrence of silicon crystal defects thereby suppressing the increase of the junction leak.

By the way, in a case of using a silicide for reducing the resistivity, it is necessary that it has a heat resistance of higher than 900° C., because annealing at a high temperature above 900° C. is necessary in order to diffuse the impurity from the silicide. Further, also in a case of not using the silicide, it is necessary to apply a high temperature annealing above 900° C. in a process such as an activation annealing after contact ion implantation subsequent to the formation of a transistor.

However, a silicide such as $TiSi_2$ alloyed by a usual heat treatment coagulates in a high temperature process about at 900° C. to increase the sheet resistance. For instance, an experiment regarding the sheet resistance shows an example that the sheet resistance is increased from 10 ohm/□ to 300 ohm/□.

OBJECT OF THE INVENTION

An object of the present invention is to overcome the foregoing problems in the prior art and provide a method of manufacturing a semiconductor device having a barrier metal layer, capable of obtaining a semiconductor device with a sufficient barrier property, attaining the formation of a wiring layer with a wiring material at a good coverage, thereby capable of obtaining a semiconductor device of high reliability and excellent reproducibility in a simple and convenient step.

Another object of the present invention is to provide a method of manufacturing a semiconductor device capable of reliably forming a shallow junction while maintaining low resistivity.

These and other objects will become apparent by reading the following description of the present invention.

SUMMARY OF THE INVENTION

The foregoing object of the present invention can be attained by an improved technique for the barrier property, that is, a method of manufacturing a semiconductor device comprising the steps of:

forming a diffusion region on a semiconductor substrate, forming a silicon compound film on the diffusion region, forming a metal film on the silicon compound film to form a metal silicide film, further forming an interlayer film.

forming a barrier metal material film on the interlayer film, then patterning the barrier metal material film to obtain a barrier metal layer, subsequently, patterning the interlayer film to form a contact hole and burying a wiring material into the contact hole thereby forming wiring.

In the present invention, any of silicon compounds can be used so long as a metal film can be formed thereon to form a metal silicide film and, for example, a silicon oxide film such as of $SiO_2$ or a silicon nitride film such as of $Si_3N_4$ can be used. A preferred thickness of the silicon compound film is from 3–30 nm since silicidation by heat treatment or the like is facilitated. Any of the metal films that can form a barrier metal by silicidation can be used and Ti, W, Co, Ni or alloys thereof (or intermetallic compound) or oxides, nitrides, oxinitrides thereof can be used.

A technique of obtaining a metal silicide film by forming a metal film on a silicon compound film has been proposed by the present applicant and the resultant metal silicide film structure is referred to as a SITOX structure. Detailed descriptions can be referred to in Japanese Patent Laid-Open Hei 2-260630 by the present applicant and IEDM90 (1990 IEEE), pp 249–252, by Hirofumi Sumi, et al, "New Silicidation Technology by SITOX (Silicidation Through Oxide) and Its Impact on Subhalf Micron MOS Devices".

According to another aspect of the present invention, a further improvement for the SITOX structure can be attained.

That is, a method of manufacturing a semiconductor device in accordance with another aspect of the present invention comprises:

forming a heat resistant silicide on a semiconductor substrate, injecting an impurity into the heat resistant silicide by ion implantation and then forming a junction region by solid phase diffusion.

The heat resistant silicide is a silicide having a property of not coagulating even at a high temperature of about 900° C. and, as an example, it can be formed as a layer obtained by applying a heat treatment at a low temperature to a metal film formed by way of a thin semiconductor compound film on a semiconductor substrate and then applying a heat treatment at a high temperature.

In a case of solid phase diffusion is performed by using an ordinary silicide so as to form a shallow junction, a sufficient heat resistance can be obtained and the electrical resistance could not be reduced. However, in the technique of forming the silicide structure as described above, since the heat resistant silicide is used, the sheet resistance is not increased even upon solid phase diffusion thereby enabling production of a semiconductor device of a shallow junction with low resistivity.

A silicide referred to as an example of a heat resistant silicide which is formed by two step annealing at low temperature and high temperature by way of a thin semiconductor compound film is disclosed in Japanese Patent Laid-Open Hei 3-38823 proposed previously by the present applicant. It has been found that the silicide has particularly sufficient heat resistance and can surely provide, when applied to the present invention, a semiconductor device of low resistivity and shallow junction.

DESCRIPTION OF THE PREFERRED EMBODIMENTS

The technique for the improvement of the barrier property in the present invention will be outlined as below with reference to an example of FIG. 1 illustrating a preferred embodiment of the present invention to be described later.

Figure 1A:
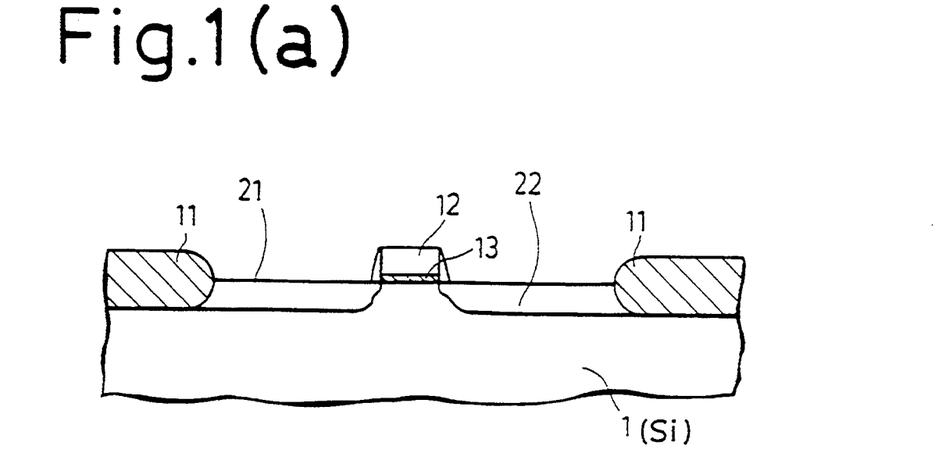
FIG. 1(a)–1(f) are cross-sectional views illustrating steps in Example 1 successively.
Figure 1B:
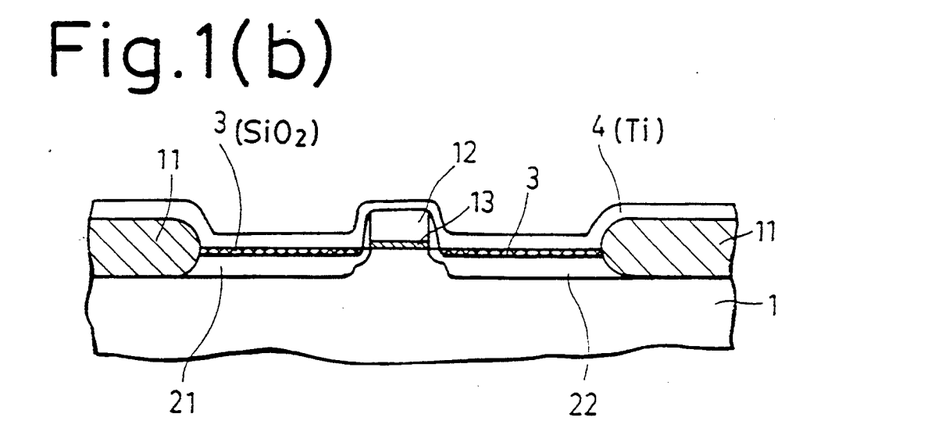
Figure 1C:
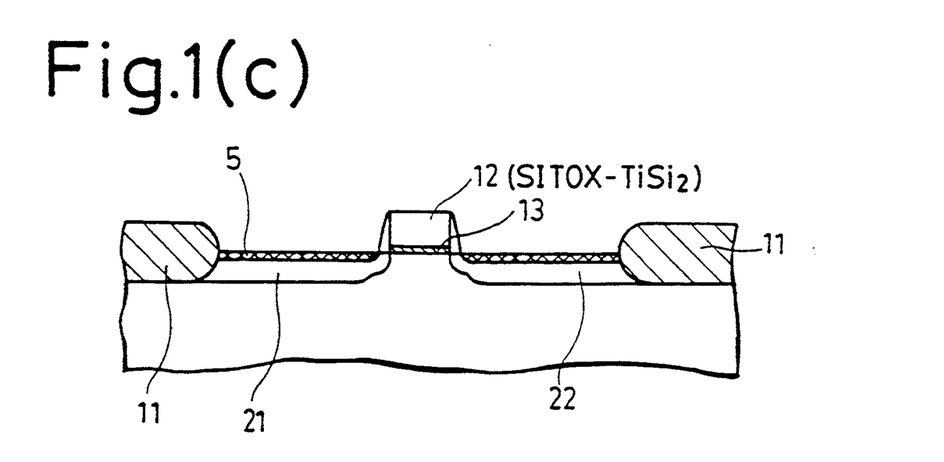
Figure 1D:
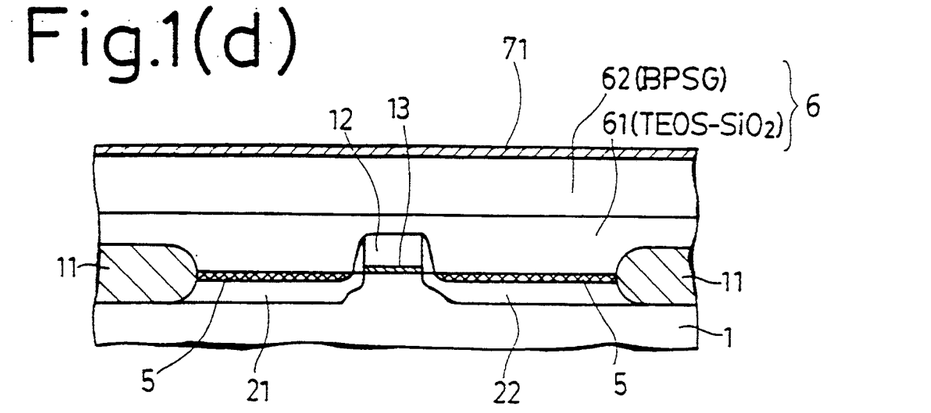
Figure 1E:
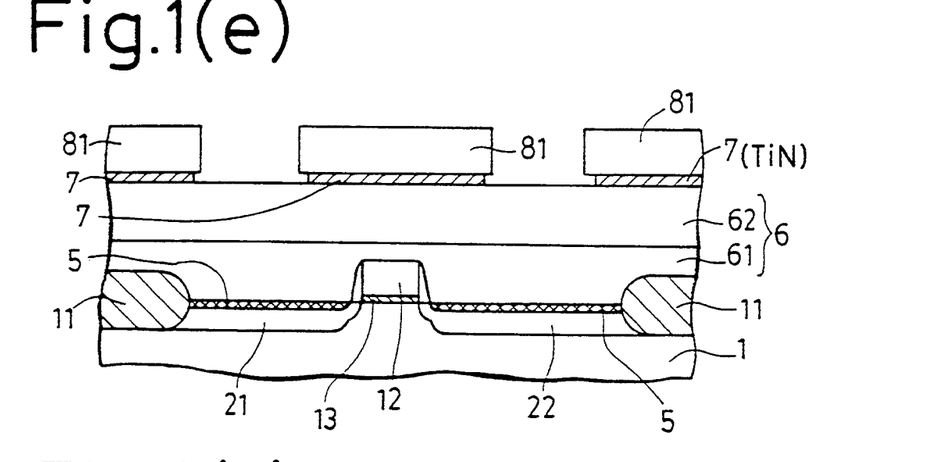
Figure 1F:
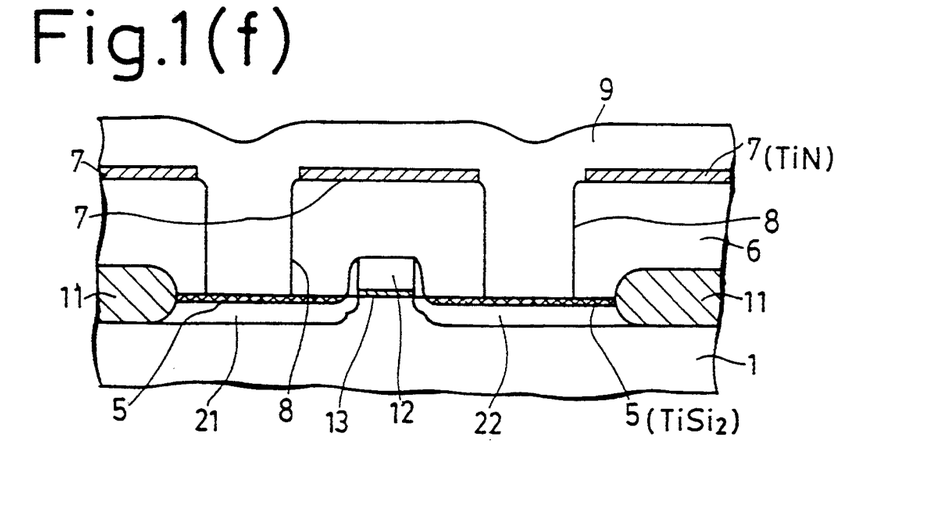

A method of manufacturing a semiconductor device according to the present invention comprises steps of forming diffusion regions 21, 22 on a semiconductor substrate 1 such as a silicon substrate as exemplified in FIG. 1(a), forming a silicon compound film 3 such as $SiO_2$ on the thus formed diffusion region 21, 22, forming a metal film 4 with a high melting metal material such as Ti on the silicon compound film 3 to obtain a structure exemplified in FIG. 1(b), forming a metal silicide film 5 (for example, titanium silicide film) by applying, for example, a heat treatment (refer to example in FIG. 1(c)), further forming an interlayer film 6, forming a barrier metal material film 71 with TiN or TiW on the interlayer film 6 to obtain a structure as exemplified in FIG. 1(d), then patterning the barrier metal material film 71 to obtain a barrier metal layer 7 (refer to the example shown in FIG. 1(e)), subsequently, patterning the interlayer film 6 to form a contact hole 8, and burying a wiring material 9 such as Al in the contact hole 8 to form a wiring thereby obtaining a structure as exemplified in FIG. 1(f).

According to the present invention, since the barrier metal layer is not formed after opening the contact hole, but the barrier metal layer is previously formed in the SITOX structure described above, it is free from such a problem that the barrier metal is formed only insufficiently at the bottom of the opening or free from such a problem that the opening is narrowed failing to bury the wiring material sufficiently, to attain an improvement for the barrier property and an improvement for the coverage of the wiring film, as well as it is possible to use the reliable process in the prior art as it is, and the process can be made simple and convenient without lowering the reliability, whereby a semiconductor device of excellent reliability and reproducibility can be obtained.

EXAMPLE

The present invention will now be explained referring to examples. It will be apparent that the present invention is not restricted by the examples described below.

Example 1

In this example, the invention is applied to a manufacture of a MOS transistor of a structure shown in FIG. 1(f). Description will be made referring to FIGS. 1(a)-(f).

In this example, a silicon substrate is used as a semiconductor substrate 1 on which LOGOS as a field oxide region 11 is formed and then a gate region 12 and a diffusion regions 21, 22 (source 21, drain 22) are formed to prepare a MOS transistor. Reference numeral 13 denotes a gate insulation film ($SiO_2$ film in this example). A structure shown in FIG. 1(a) is thus obtained.

Then, a thermally oxidized film of about 5 nm is formed over the entire surface and the oxide film ($SiO_2$ film) is used as a silicon compound film 3 and, further, Ti is deposited to 30 nm thickness over the entire surface as a metal film 4. The structure of FIG. 1(b) is thus obtained.

Then, a metal silicide film 5 (SITOX-$TiSi_2$) is formed only on the diffusion layers 21, 22 by a two step annealing method. The two step annealing method is a process for obtaining the SITOX structure by a heat treatment of the following first and the second annealing. First Annealing:
650° C., 30 sec, etching by aqueous ammonia hydrogen peroxide Second Annealing:
900° C., 30 sec This provides a structure of FIG. 1(c) in which the metal silicide film 5 (SITOX-$TiSi_2$) covers the diffusion regions 21, 22 as the source/drain region. The SITOX-$TiSi_2$ is a film having a barrier property Al as reported in the literature by H. Sumi, et al described above.

Subsequently, the interlayer film 6 is formed into a flattened film with a CVD oxide film 61 ($SiO_2$ film), for example, TEOS (Tetraethoxy Orthosilicate) and formed with a film 62 such as BPSG (Boro-phospho silicate glass). The interlayer film may also be formed by any other means by using, for example, a silicon-containing organic gas such as DADBS, TMCTS and DES or using an impurity glass such as AsSG, BSG or PSG. Successively, TiN (titanium nitride) as a barrier metal material in this case is formed by sputtering. Thus, a structure shown in FIG. 1(d) having a barrier metal material film 71 is obtained. Use of TiN as in this example is preferred since it can provide satisfactory barrier property and good stress migration preventive performance. For example, if stresses are caused by a passivation film or the like formed on the upper layer, TiN moderates stress of Al. When TiW or the like having good conductivity is used instead of TiN, disconnection failure can be prevented even when the Al wiring or the like is disconnected.

Then, a photoresist pattern 81 is formed for forming a contact hole 8 by patterning using usual photolithography. Then, TiN as the barrier metal material film 71 is isotropically etched by aqueous hydrogen peroxide to form a structure having a barrier metal layer 7 as shown in FIG. 1(e). For the isotropic etching, an isotropic dry etching means which is a plasma etching by $CF_4$ or the like may be used. For the condition of the etching with $CF_4$, the following conditions can be adopted for instance.

$CF_4/Ar/O_2$=45/50/5 sccm, 106.4 Pa, 300 W.

Successively, the interlayer film 6 as the underlying oxide film is anisotropically etched with a gas such as $CHF_3$ to form the contact hole 8. The etching conditions can be set, for example, as: $C_4F_8$=50 sccm, RF power: 1200 W, 2 Pa.

Subsequently, the contact hole 8 is buried by high temperature Al sputtering, to obtain the structure shown in FIG. 1(f). For the Al forming conditions, the following Al burying conditions and high temperature for two steps can be used. First Step:
22.5 KW, Ar 100 sccm, 0.47 Pa, 1.2 μm/min Second Step:
10.5 KW, 500° C., Ar 100 sccm, 0.47 Pa, 0.6 μm/min In this example, a semiconductor device (MOS transistor) overcoming the foregoing problems in the prior art can be obtained with good reproducibility by a customary step of good reliability.

Example 2

In this example, the same technique as in Example 1 described above is applied to the manufacture of a bipolar transistor. Description will be made referring to FIG. 2.

Figure 2:
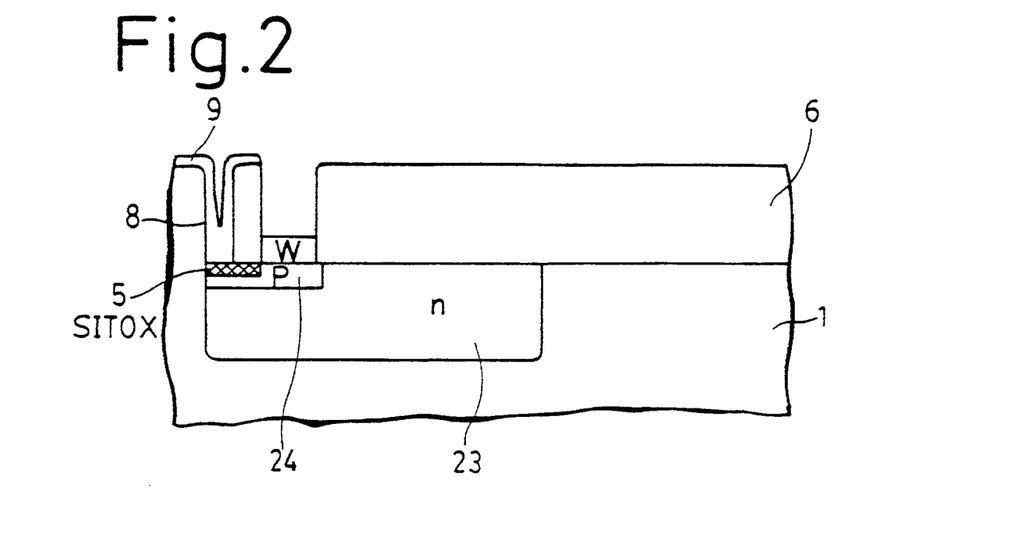
FIG. 2 is a cross-sectional view showing Example 2.

In this example, a metal silicide film 5 of a SITOX structure is formed on a P diffusion region 24 on an n-type well 23 of a semiconductor substrate 1 such as of silicon by the same method as in Example 1, and contact hole 8 is formed thereabove and a wiring material 9 is buried. The present invention can be used effectively also in the manufacture of such a bipolar transistor structure.

Example 3

In this example, a semiconductor device having a MOS transistor is manufactured by a method of forming a thin silicon oxide film of about less than 5 nm on a diffusion region, forming a Ti film for silicidation on the silicon oxide film, and applying a two step annealing, ion implantation and solid phase diffusion. Description will be made according to the manufacturing steps with reference to FIG. 5(a)-(f) and FIG. 6.

Figure 5A:
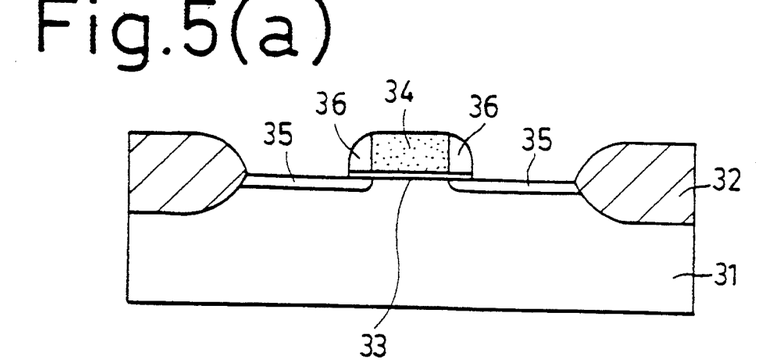
FIG. 5(a)–5(f) are cross-sectional views illustrating steps in Example 3 successively.

At first, a thick field oxide film 32 is formed to the surface of a silicon substrate 31 by a selective oxidation. Then, a thin gate oxide film 33 is formed on the surface of a substrate in a region surrounded with the field oxide film 32 and then a polysilicon layer 34 is further formed on the gate oxide film 33. Then, the polysilicon layer 34 is patterned by lithography to a required pattern of a gate electrode.

Then, ion implantation at a low concentration is conducted in self alignment using the patterned polysilicon layer 34 and the field oxide film 32 as a mask to form impurity diffusion regions 35, 35 at low concentration on the surface of the substrate. The low concentration impurity diffusion regions 35, 35 moderate the concentration of an electric field near the drain of the MOS transistor and the MOS transistor is constituted as a so-called LDD structure.

Then, a CVD silicon oxide film is formed on the entire surface and the CVD silicon oxide film is etched back to form side walls 36, 36 comprising the residue of the CVD silicon oxide film on the sides of the polysilicon layer 34 as a gate electrode.

Figure 5B:
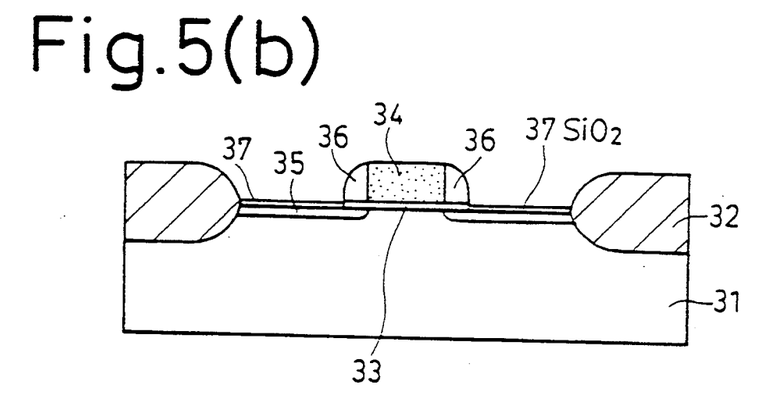

After forming the side walls 36, 36, silicon oxide films 37, 37 each of 5 nm thickness are formed to the exposed surface of silicon substrate 31 as shown in FIG. 5(b). The conditions for forming the silicon oxide films 37, 37 can be attained, for example, by placing the substrate in a furnace at 850° C. in a dry $O_2$ atmosphere for 15 min. Since the silicon oxide films 37, 37 are extremely thin films, silicon of the substrate is supplied through the silicon oxide films 37, 37. If the thickness of the silicon oxide films 37, 37 is increased to greater than 7 nm silicon is no more supplied from the substrate due to such increased thickness and the sheet resistance is rather increased.

Figure 5C:
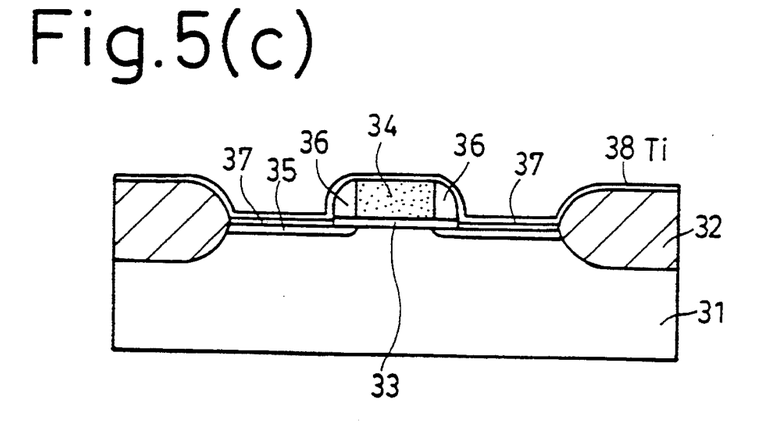

After forming the silicon oxide films 37, 37, a Ti film 38 is formed over the entire surface including the silicon oxide films 37, 37 and, thus, a structure shown in FIG. 5(c) is obtained. The thickness of the Ti film 38 is for example, 30 nm and the conditions for the deposition are, for example, Ar: 40 sccm, pressure: 0.4 Pa, deposition temperature: 200° C. and deposition rate: 60 nm/min under RF bias of 50 W and sputtering power of DC 1 KW.

After forming the Ti film, a first annealing treatment is applied. The annealing treatment is conducted, for example, by RTA (Rapid Thermal Annealing) in an Ar atmosphere, and the first annealing treatment is applied at a low temperature at 650° C. for 30 sec. Silicidation for titanium is conducted by the low temperature first annealing treatment and a titanium silicide film comprising TiSi and $Ti_5Si_3$ is formed in a region to which silicon is supplied. Further, the Ti film 38 on the titanium silicide film is oxidized into a TiOx (titanium oxide) film.

After the first annealing treatment, the Ti film or TiOx film on the titanium silicide film is removed by using aqueous ammonia: hydrogen peroxide before a second annealing treatment. An example of the aqueous ammonia hydrogen peroxide used is $NH_4OH:H_2O_2$:-$H_2O = 1:2:2$. The etching is applied, for example, by dipping for about 10 min. Unreacted Ti film and oxidized TiOx film were removed by the etching using the aqueous ammonia-hydrogen peroxide. Upon removal, the Ti film 38, for example, on the side wall 36 and at the surface of the field oxide film 32 were removed to obtain a SALICIDE structure in which silicide is formed in self alignment only on the surface of the source-drain region and the upper surface of the polysilicon layer 34 as the gate electrode.

Figure 5D:
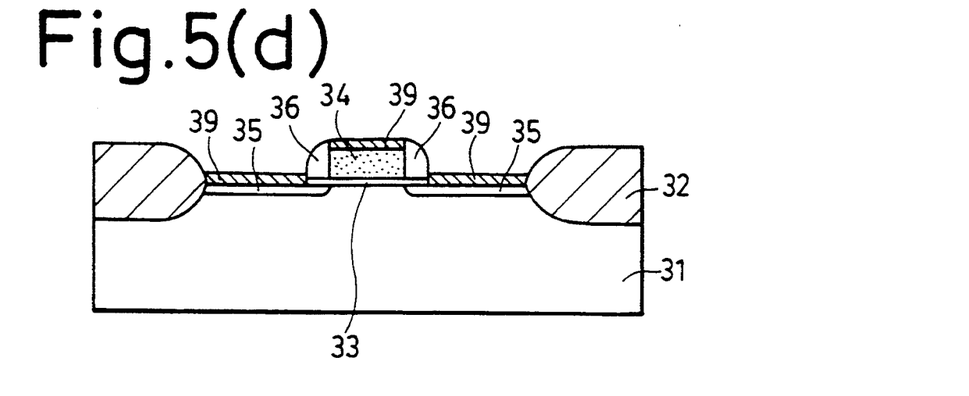

Then, a high temperature second annealing treatment is conducted. The conditions for the annealing treatment were, for example, at 900° C. for 30 sec in a nitrogen atmosphere, by RTA method. By the second annealing treatment, the titanium silicide film comprising TiSi and $Ti_5Si_3$ is converted into a titanium silicide film 39 comprising a stable $TiSi_2$ film of low resistivity. The titanium silicide film 30 comprising the $TiSi_2$ film is formed on the upper surface of the gate electrode and at the surface of the silicon substrate 31 as the source-drain region as shown in FIG. 5(d), to reduce the resistivity in each of the portions. Further, since the titanium silicide film 39 formed by two step annealing after forming the thin oxide film has heat resistance of not causing coagulation even at a high temperature, and the low resistivity can be maintained even after successive high temperature steps.

Figure 5E:
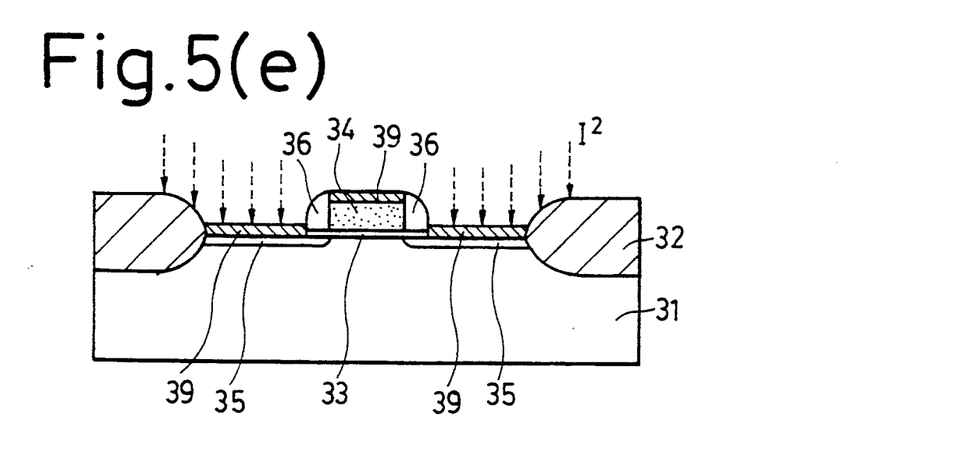

After the two step annealing treatment at low and high temperature, an impurity is driven into the titanium silicide film 39 by ion implantation. In this case, the side wall 36 and the field oxide film 32 also function as a portion of a mask. The impurity spiked is for forming a high concentration impurity diffusion region for the source-drain region. Since spiking of the impurity by the ion implantation is not applied directly to the substrate, damages caused to the substrate can be suppressed to moderate junction leak due to crystal defects. The ion implantation is conducted by using, for example, As (arsenic) as the dopant and under the conditions of 50 KeV, $3 \times 10^{15}/cm^2$.

Figure 6:
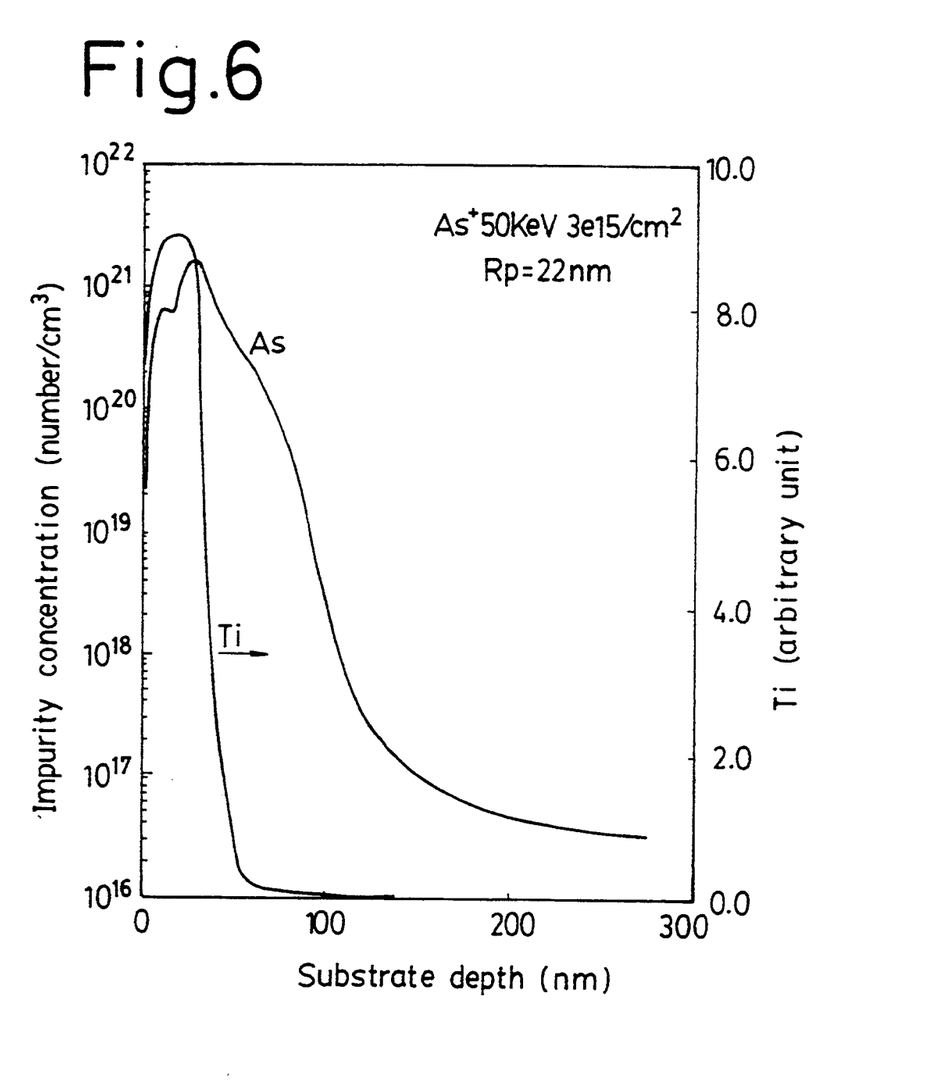
FIG. 6 is a graph illustrating a result of analysis for the distribution of impurity just after ion implantation of As in the step of Example 3.

FIG. 6 shows a profile of an impurity when As is ion implanted by SIMS (Secondly Ion Micro Analysis) in which the abscissa indicates the depth of the substrate by the unit of nm, while the ordinate indicates the concentration distribution for Ti by an arbitrary unit, an impurity concentration for As by the unit of number/$cm^3$. Also as shown in FIG. 6, the peak of the As (arsenic) dopant to be ion implanted is within a depth of 50 nm in which Ti is enriched by silicidation. Generally, it has been known that the region of damage caused by ion implantation situates to about 75% of the project range from the surface (refer, for example, to Super LSI Process Data Handbook, p 248, published from Science Forum Co.), and can be seen that a portion of the As dopant diffuses into somewhat deep inside of the silicon substrate 31, but the region in which the damage occurs is restricted to the inside of the titanium silicide film 39 and the damage to the substrate does not reach a deep level.

In a case where the impurity is spiked not into the silicide film but directly into the silicon substrate as in the prior art, silicon transfer has been caused on the side of the side wall due to synergistic effects of the damage to the substrate and the high temperature annealing in the subsequent process (a sort of crystal defects). However, if the impurity is ion implanted in the titanium silicide film 39 as in this example, damages are not caused to the silicon substrate and, no crystal defects occur after finally applying a high temperature process.

Figure 5F:
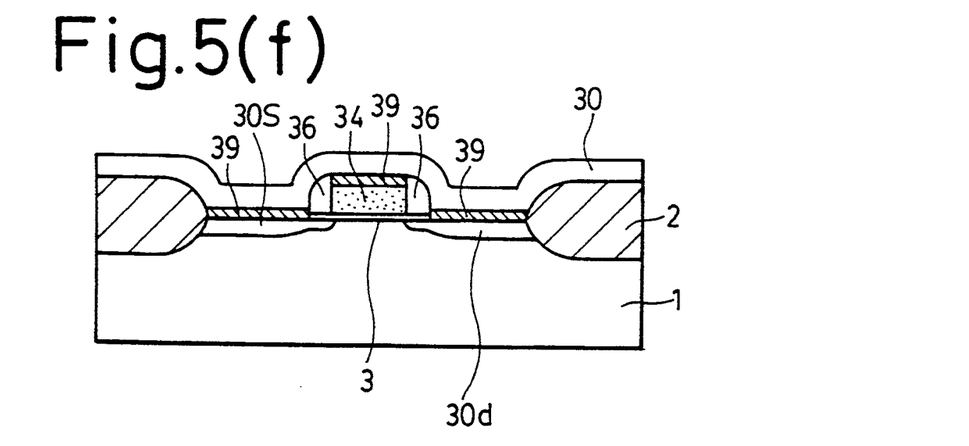

Subsequent to the ion implantation, an interlayer insulation film 30 comprising a CVD silicon oxide film is deposited over the entire surface. The conditions for depositing the interlayer insulation film 30 are set, for example, as $SiH_4:O_2:N_2 = 250:250:100$ sccm, 420° C., 13.3 Pa and 0.5 μm. Then, after forming the interlayer insulation film 30, annealing is applied, for example, in a $N_2$ atmosphere at a temperature of 1100° C. for 10 sec. By the short time annealing, the region spiked with the impurity and the silicide are actuated to form source drain regions 30s, 30d of a sufficiently shallow junction. A temperature at 1100° C. is applied during annealing, since the titanium silicide film 39 has such heat resistance as not causing coagulation even at a high temperature as described above, sheet resistance can be maintained at a low resistivity.

Then, a semiconductor device having a MOS transistor is completed by way of required forming for electrode and the like.

Figure 8:
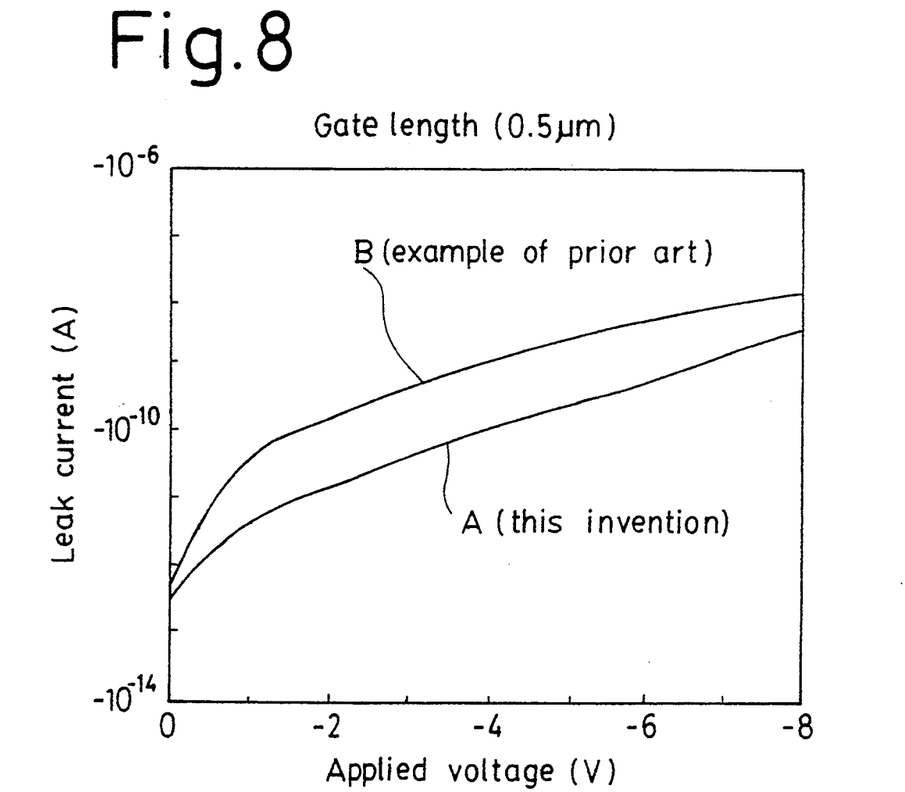
FIG. 8 is a characteristic graph for comparing applied voltage-to-leak current characteristics of a MOS transistor in Example 3 with characteristics of a MOS transistor in the steps of the prior art.

In the MOS transistor formed in this example, the junction leak in the MOS transistor of this example shown by a curve A is greatly decreased by about 1 digit as compared with that in the prior art shown by the curve B as shown in FIG. 8. Further, a sheet resistance at a low resistivity can be obtained simultaneously and the resistivity of the sheet resistance obtained in this example is, for example, as low as about 8 ohm/□.

Example 4

This examples applies a process of forming a silicide on a thin silicon compound film and obtaining a shallow junction at a low resistivity by two step annealing to a process for a bipolar transistor and description will now be made with reference to FIG. 7(a)-(m) for this example.

Figure 7A:
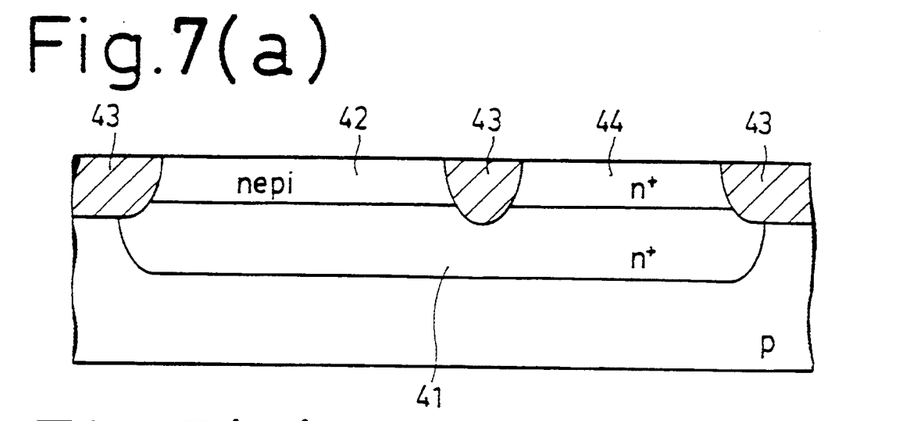
FIG. 7(a)–7(m) are cross-sectional views illustrating steps of Example 4 successively.

At first, a p-type well region is formed to an n-type silicon substrate and an n-type epitaxial layer 42 is formed on an n+-type buried layer 41 in the p-type well region. After forming the n-type epitaxial layer 42, a field oxide film (LOCOS film) 43 is formed by selective oxidation and, as shown in FIG. 7(a), the surface of the field oxide film 43 is cut into a flat surface and a collector take-out region 44 is formed in a region in communication with the epitaxial layer 42 by way of the buried layer 41 below the field oxide film 43.

Figure 7B:
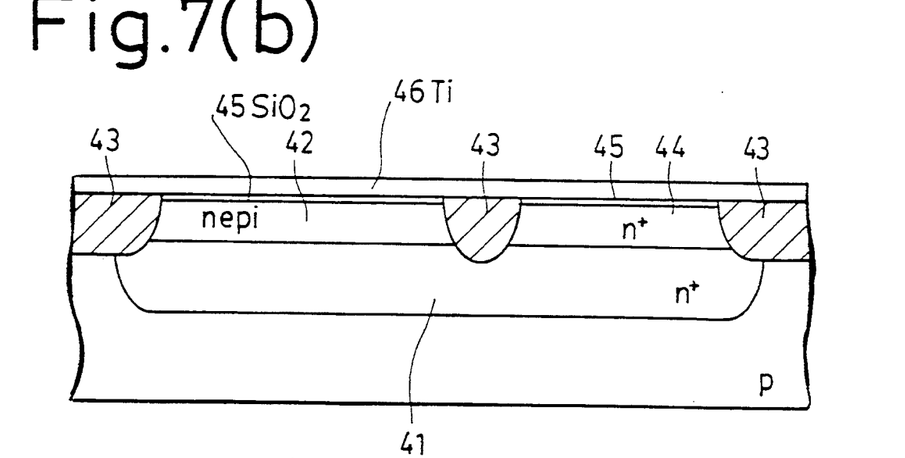

Then, a silicon oxide film 45 of 5 nm thickness is formed to the surface of the substrate. The thin silicon oxide film 45 is formed, for example, by short time thermal oxidation. After forming the silicon oxide film 45, a Ti film 46 is formed over the entire surface as shown in FIG. 7(b). The Ti film 46 can be formed by the same sputtering as in Example 3 and it is formed to a thickness of about 30 nm.

Figure 7C:
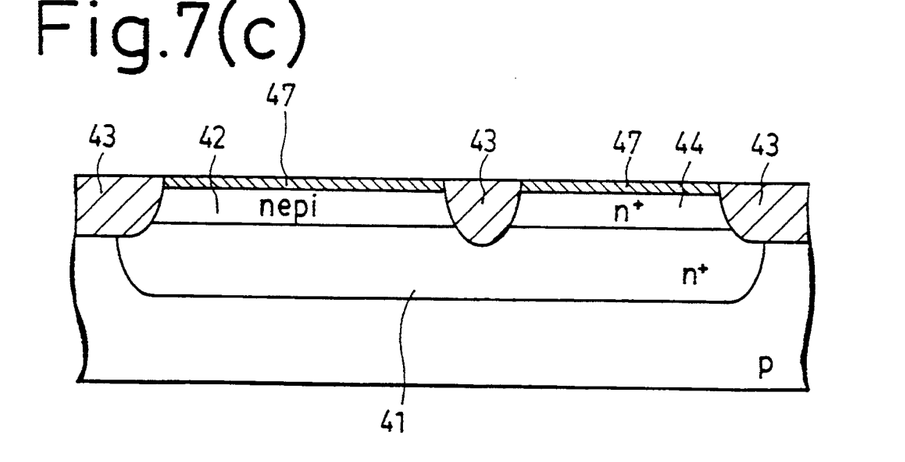

After laminating the Ti film 46 on the thin silicon oxide film 45, a titanium silicide film 47 is formed by two step annealing as shown in FIG. 7(c). Referring to the alloying treatment, an annealing treatment at low temperature is at first applied in an Ar atmosphere under the conditions at 650° C. for 30 sec by RTA method. By the annealing treatment silicon and Ti are alloyed by way of a thin oxide film to form a silicide comprising TiSi and Ti$_5$Si$_3$. After the first annealing treatment, the substrate is dipped into an aqueous ammonia hydrogen peroxide for about 10 min to remove unreacted Ti and TiOx. That is, the Ti film 46 on the field oxide film 43, etc. is removed. Successively, an annealing treatment at high temperature of 900° C. is applied for 30 sec in a nitrogen atmosphere. By the annealing treatment at high temperature, a titanium silicide film comprising TiSi$_2$ is formed and the exposed surface of the silicon substrate is covered with a heat resistant titanium silicide film 47.

Figure 7D:
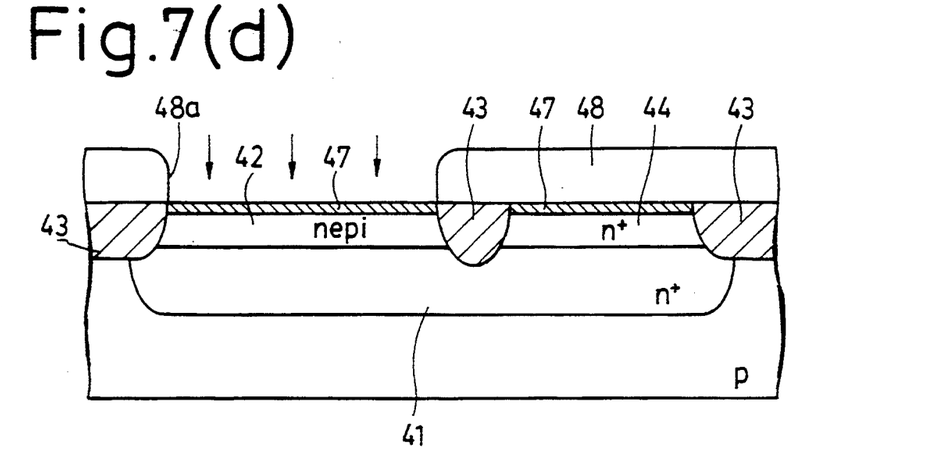

Next, a resist film is coated over the entire surface and, by way of selective exposure and developing step, a resist mask 48 is formed on the substrate. The resist mask 48 is set to a pattern having an opening 48a in the base-emitter region. Then, an impurity is ion implanted for forming the base region by using the resist mask 28 as a mask as shown in FIG. 7(d). Particularly, in this ion implantation, ions are not directly implanted at such a high energy as giving damages to the silicon substrate but the impurity is spiked into the titanium silicide film 47 at the surface of the substrate. Referring to one example for the condition of the ion implantation, ion may be implanted under the conditions of using BF$_2$ as a dopant, at 20 KeV by $1 \times 10^{15}$/cm$^2$.

Figure 7E:
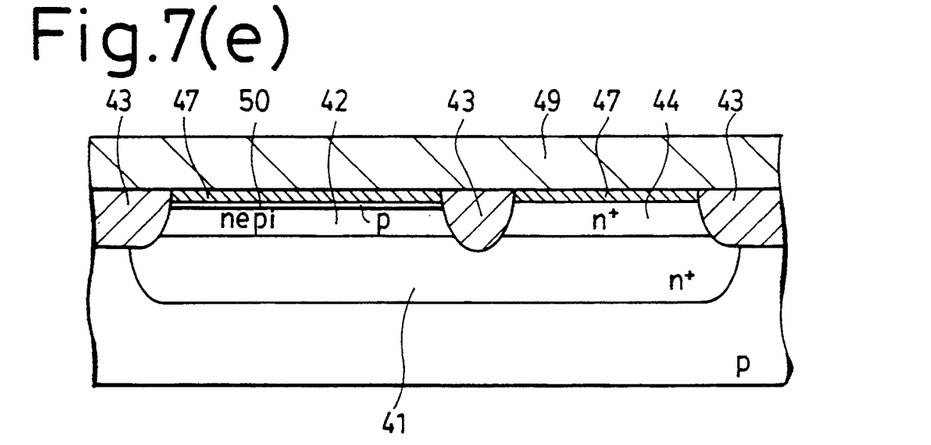

After applying ion implantation to the titanium silicide film 47, an interlayer insulation film 49 is formed over the entire surface as shown in FIG. 7(e). The interlayer insulation film 49 comprises a CVD silicon oxide film and it is formed under the conditions, for example, at SiH$_4$:O$_2$:N$_2$=250:250:100 sccm, 420° C. and 13.3 Pa. An interlayer insulation film 49 having a thickness of about 50 nm is formed by the CVD.

After forming the interlayer insulation film 49, a short time annealing is applied at 1100° C. for 10 sec in a nitrogen atmosphere. By the annealing, the silicon substrate and the titanium silicide film 47 are activated and, at the same time, a base region 40 comprising a p-type impurity diffusion region are formed just below the titanium silicide film 47 by the impurity diffusion from the titanium silicide film 47. During annealing, a high temperature treatment at 1100° C. is applied. In this example, since a heat resistant silicide film is formed by two step annealing by way of the thin oxide film 45, no coagulating phenomenon of the silicide as in the prior art occurs but the titanium silicide film 47 maintains its low resistivity.

Figure 7F:
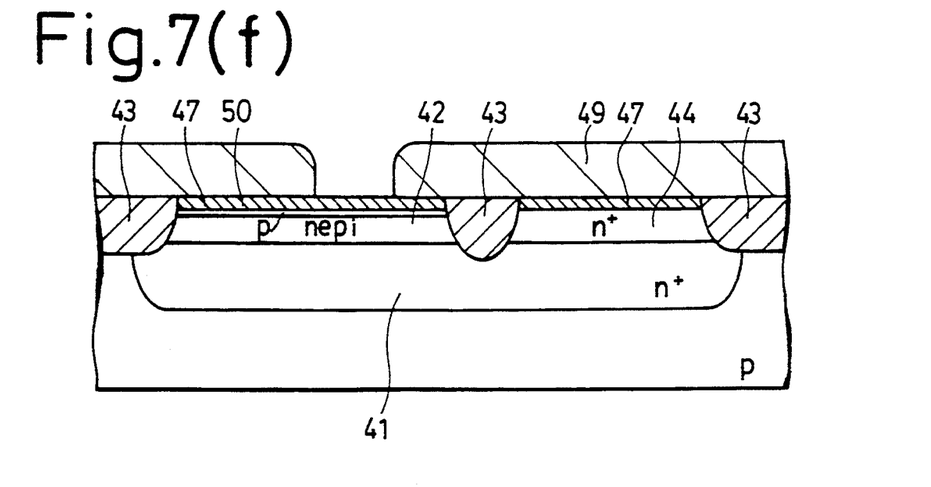

Then, the interlayer insulation film 49 of a region in which an emitter region is to be formed is removed. The selective removing step is carried out by coating a resist layer over the entire surface, forming a resist mask opened at a region corresponding to the emitter region by selective exposure and development and, thereafter, removing the interlayer insulation film 49 in alignment with the mask pattern by dry etching using the resist mask. Then, a structure shown in FIG. 7(f) is obtained. The conditions for the dry etching are, for example, C$_4$F$_8$ gas, 50 sccm, RF power: 1200 W and 2 Pa.

Figure 7G:
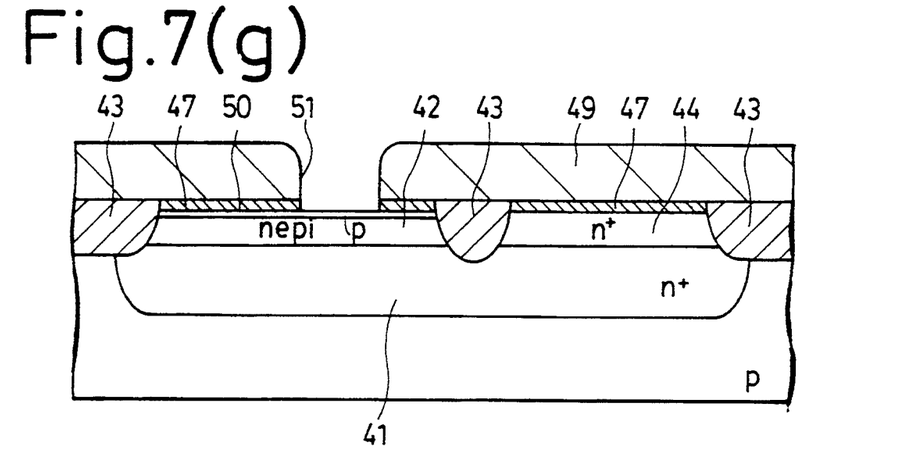

After forming the opening to the interlayer insulation film 49, the titanium silicide film 47 at the bottom of the opening 51 is removed by hydrofluoric acid to expose the surface of the substrate as shown in FIG. 7(g). An aqueous solution of hydrofluoric acid is adjusted, for example, as H$_2$O:HF =100:5 and the surface of the substrate appears after dipping for about 3 min.

Figure 7H:
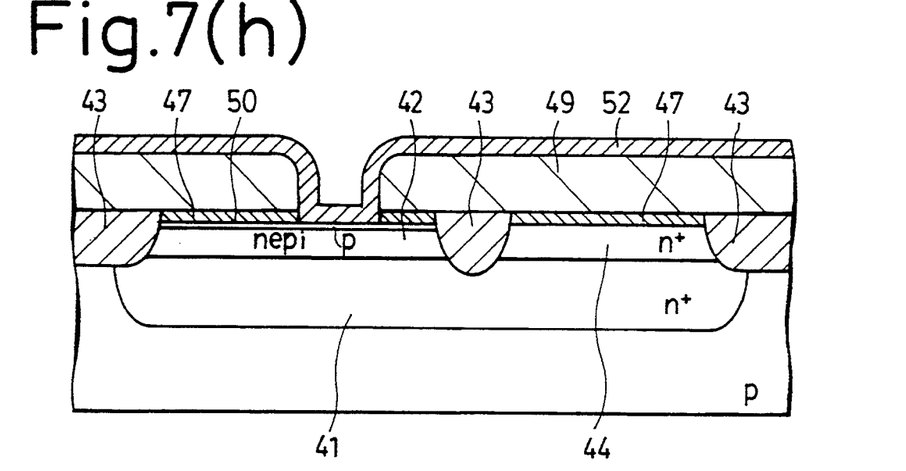

After exposing the surface of the substrate to be an emitter region, a CVD silicon oxide film 52 is formed over the entire surface to a thickness of about 0.3 μm as shown in FIG. 7(h). The CVD silicon oxide film 52 is formed under the conditions, for example, at SiH$_4$:O$_2$:N$_2$=250:250:100 sccm, 420° C., 13.3 Pa.

Figure 7I:
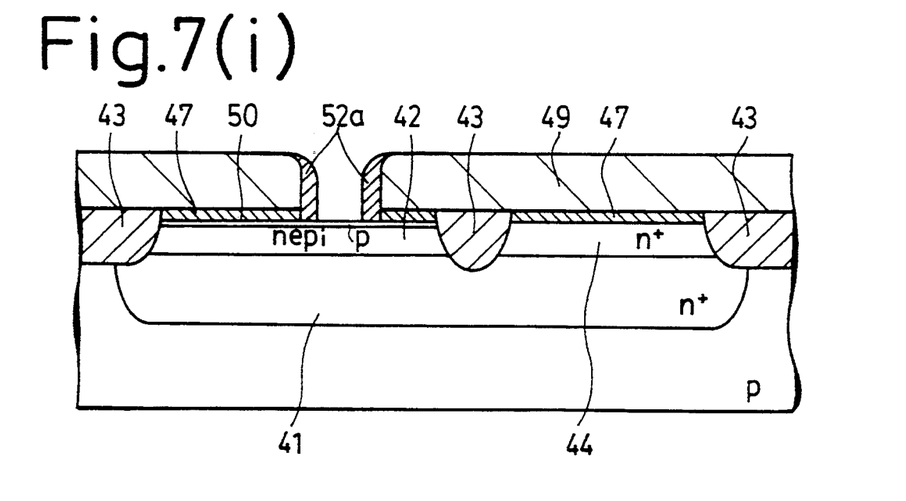

As shown in FIG. 7(i), the thus formed CVD silicon oxide film 42 is etched back over the entire surface to leave the CVD silicon oxide films 52a, 52a on the side walls of the opening 51. The conditions for etching back are, for example, C$_4$F$_8$ gas at 50 sccm, RF power of 1200 W and a pressure of 2 Pa. By the etching back, the CVD silicon oxide film 52 is formed as a so-called side wall, which contributes to the formation of a fine emitter region and, at the same time, separation in self alignment can be attained between the base and the emitter.

Figure 7J:
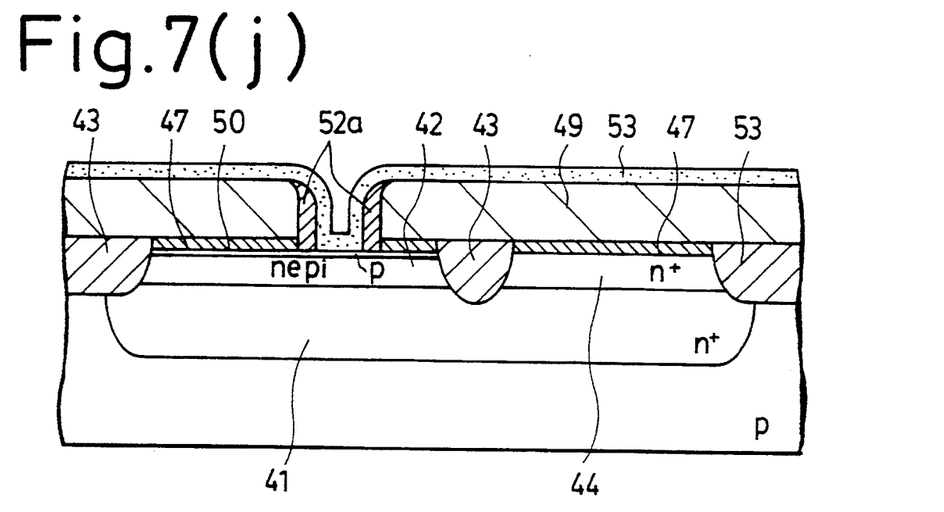

When the surface of the substrate is exposed between the CVD silicon oxide films 52a that function as the side walls, a doped polysilicon layer (DOPOS layer) 53 containing an n-type impurity at a high concentration is formed over the entire surface as shown in FIG. 7(j). The conditions for forming the doped polysilicon layer 53 are, for example, at $SiH_4:H_2:N_2=100:400:200$ sccm and 70 Pa, and the layer is formed to a thickness of about 0.15 μm.

After forming the doped polysilicon layer 53, the doped polysilicon layer 53 is left only at the inside of the opening 51, and the other doped polysilicon layer 53 on the interlayer insulation film 49 is removed by resist patterning and etching. As the conditions for the removal, a microwave etcher is used, for example, and the conditions are, set as $SF_6$:Fron 113=5:44 sccm, 1.33 Pa, magnetron filament current of 220 mA and RF power of 100 W.

Figure 7K:
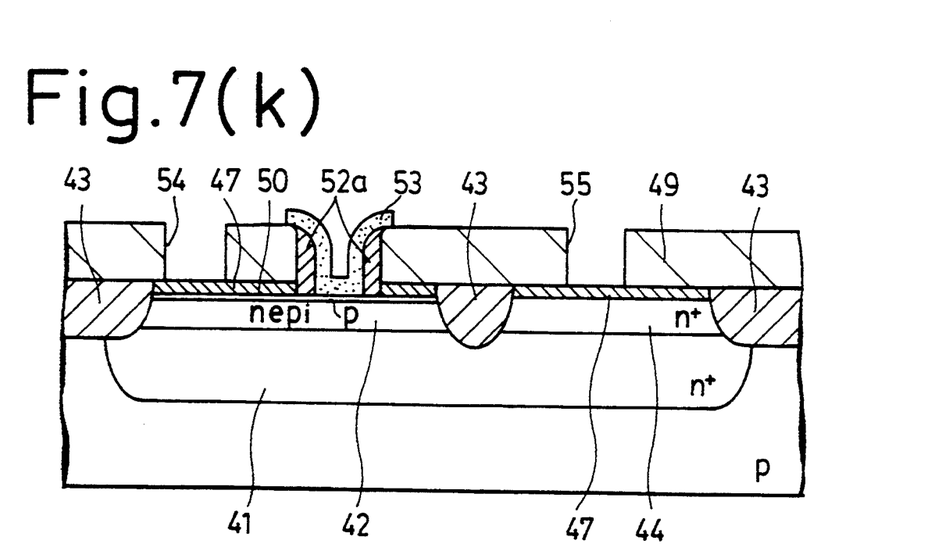

Then, as shown in FIG. 7(k), contact holes 54, 55 are formed from the surface of the interlayer insulation film 49. The contact hole 54 is for taking-out the base electrode, while the contact hole 55 is for taking-out the collector electrode. For forming the contact holes 54, 55, a resist pattern as a mask is formed and, subsequently, the interlayer insulation film 49 is fabricated by dry etching using the resist pattern. As an example of the dry etching conditions, there can be mentioned $C_4F_8$ gas at 50 sccm, RF power of 1200 W and a pressure of 2 Pa. By the formation of the contact holes 54, 55, a titanium silicide membrane 47 with low resistivity is present at the bottom of the contact holes 54, 55.

Figure 7L:
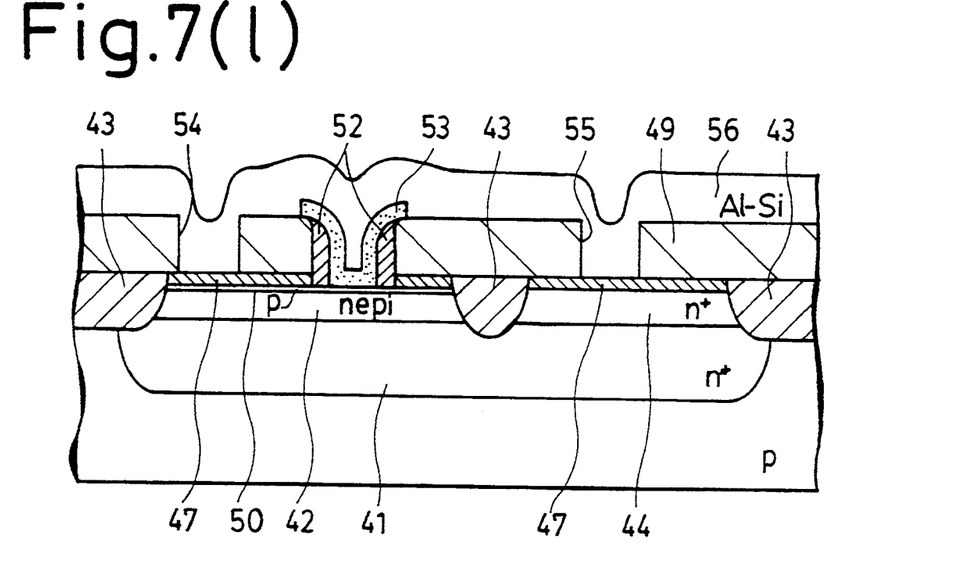

Then, as shown in FIG. 7(l), an aluminum type wiring layer 56 is formed over the entire surface. The aluminum type wiring layer 56 is a layer containing silicon or copper in aluminum and can be formed under the conditions: an Ar gas at 40 sccm, a pressure at 0.4 Pa and a sputtering power of DC 6 KW, a rate of 0.8 μm/min, and the layer is formed to a film thickness, for example, of 0.8 μm.

Figure 7M:
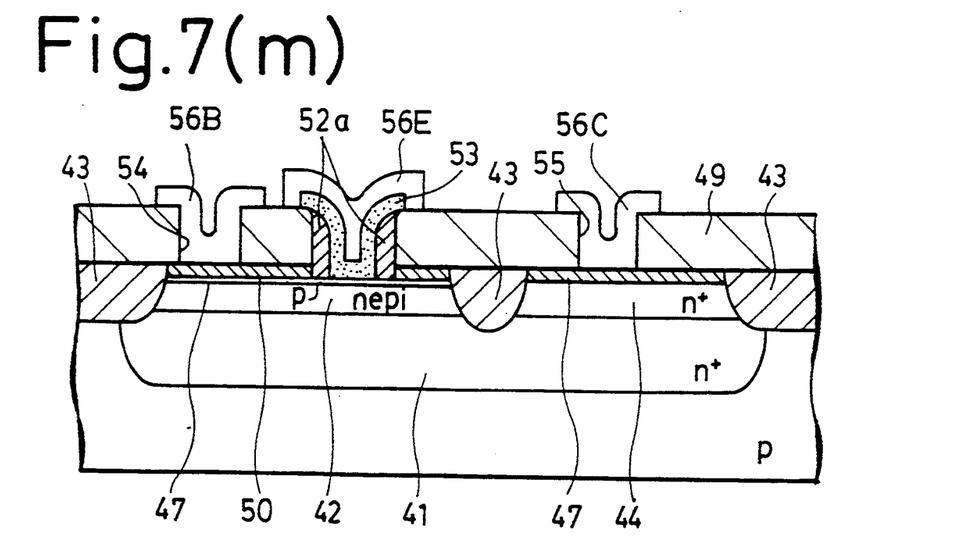

After forming the aluminum type wiring layer 56 over the entire surface, as shown in FIG. 7(m), the aluminum type wiring layer 56 is patterned on every electrode. The patterning is applied by a resist mask and dry etching to form a base electrode 56B, an emitter electrode 56E and a collector electrode 56C each comprising the aluminum type wiring layer are formed respectively. As the conditions for the dry etching, an RF application type ECR etcher is used and etching is conducted under the conditions at $BCl_3:Cl_2=60:90$ sccm, a microwave power of 1000 W, an RF power of 50 W and a pressure of 2.13 Pa. After each of the electrodes 56E, 56B and 56C is formed in this way, a bipolar transistor is completed in accordance with usual steps.

In the bipolar transistor manufactured by the manufacturing step as described above, since a titanium silicide film 47 of sufficient heat resistance is formed not by a usual silicide but by two step annealing by way of a thin silicon oxide film 45, no coagulation occurs even after the high temperature annealing at about 1100° C., thereby enabling to maintain the titanium silicide film 47 to a low resistance. With the titanium silicide film 47, the response speed of the device can be increased by about 20% as compared with a case of not forming the silicide.

Further, since the base region 50 is formed by the solid phase diffusion of the impurity from the titanium silicide film 47 and the impurity is not spiked directly into the silicon substrate, the damage no more occurs and a bipolar transistor free from undesired effects caused by crystal defects can be formed. Further, in a method of forming Ti within a region already doped with p-type boron at a high concentration and siliciding the same by annealing as in the existent manufacturing method, boron and Ti are brought into reaction to form a compound of boron and titanium such as $TiB_2$, making it difficult to form $TiSi_2$. However in this example, it is relatively easy to form $TiSi_2$, and the sheet resistivity shows an outstandingly excellent value of about 5 ohm/□ finally.

Although descriptions have been made in the foregoing examples with respect to an npn type bipolar transistor, the manufacturing method for the semiconductor device according to the present invention is applicable also to various kinds of processes such as for pnp-type bipolar transistors, CMOS bipolar transistors and lateral type bipolar transistors.

What is claimed is:

1. A method of manufacturing a semiconductor device which comprises the steps of:
   forming a diffusion region in a semiconductor substrate,
   forming a silicon compound film on said diffusion region,
   forming a metal film on said silicon compound film,
   converting the metal film and silicon compound film into a metal silicide film,
   forming an insulating interlayer film on said metal silicide film,
   forming a barrier metal layer on said insulating interlayer film, then
   patterning said barrier metal layer to expose a selected portion of the insulating interlayer film, subsequently
   etching the exposed selected portion of said insulating interlayer film to form at least one contact hole exposing a portion of the silicide film, and
   depositing a wiring material into said contact hole and into contact with said silicide film to form a wiring.

2. A method according to claim 1, wherein said device is a MOS transistor.

3. A method according to claim 1, wherein said device is a bipolar transistor.

4. A method according to claim 1, wherein the step of converting the metal film and silicon compound into a metal silicide film includes a two-step annealing process, which includes a low temperature annealing followed by a high temperature annealing.

* * * * *